United States Patent [19]

Bales et al.

[11] Patent Number: 5,233,303
[45] Date of Patent: Aug. 3, 1993

[54] PORTABLE DEDICATED ELECTRON SPIN RESONANCE SPECTROMETER

[76] Inventors: Barney Bales, 18122 Nordhoff Ave., Northridge, Calif. 91325; Albert J. Bauman, 524 Oakdale Dr., Sierra Madre, both of Calif. 91024

[21] Appl. No.: 704,612

[22] Filed: May 23, 1991

[51] Int. Cl.[5] .......................................... G01R 33/20
[52] U.S. Cl. ............................................................ 324/316
[58] Field of Search ............... 324/300, 307, 309, 316, 324/318, 322

[56] References Cited

U.S. PATENT DOCUMENTS

| | | | |
|---|---|---|---|
| 3,087,888 | 5/1963 | Saraceno | 324/316 |
| 3,100,280 | 8/1963 | Hyde | 324/316 |
| 3,113,263 | 12/1963 | Collins | 324/316 |
| 3,714,550 | 1/1973 | Hyde | 324/316 |
| 3,879,653 | 4/1975 | Hyde et al. | 324/316 |
| 4,560,663 | 12/1985 | Nicksic et al. | 324/316 |
| 4,674,513 | 6/1987 | Jasper, Jr. | 324/316 |
| 4,803,624 | 2/1989 | Pilbrow et al. | 324/316 |
| 4,812,763 | 3/1989 | Schmalbein | 324/316 |
| 4,888,554 | 12/1989 | Hyde et al. | 324/316 |
| 5,030,914 | 7/1991 | Jasper, Jr. | 324/316 |

FOREIGN PATENT DOCUMENTS

| | | | |
|---|---|---|---|
| 1221564 | 3/1986 | U.S.S.R. | 324/316 |
| 1363039 | 12/1987 | U.S.S.R. | 324/316 |
| 1449878 | 1/1989 | U.S.S.R. | 324/316 |

Primary Examiner—Michael J. Tokar
Assistant Examiner—Raymond Y. Mah
Attorney, Agent, or Firm—Wagner & Middlebrook

[57] ABSTRACT

An electron spin resonance spectrometer which is dedicated to a specific narrow range of tasks is reduced in size such that, as contrasted with the usual laboratory ESR spectrometers, it is easily and readily portable and can be carried to various locations to conduct tests. It uses a much smaller magnet structure than usual, a self contained single board computer, and a microwave source which is adjustable by the computer. The microwave source operates in the 2 GHz range and is connected through a circulator with a matching circuit which inductively couples the microwave signal to a sample chamber/resonator positioned in the magnetic field of the magnet structure. An oscillator provides a audio frequency signal which is combined with a slow ramp signal from the computer to modulate the output of the magnet structure. Reflected energy from the sample chamber/resonator is detected and supplied to a special amplifier which separates detector current and the ESR voltage signal, sending the detector current signal to the computer for controlling the microwave frequency and the ESR voltage to a phase sensitive detector which compares it with the audio frequency reference signal from the oscillator. Most of the noise is removed in the phase sensitive detector since it passes only those parts of the ESR signal which are in phase with the oscillator signal. The computer uses this signal to provide an output and also to provide a correction signal to the matching circuit to maintain the optimum impedance match between the resonator and the matching circuit.

24 Claims, 3 Drawing Sheets

FIG. 2
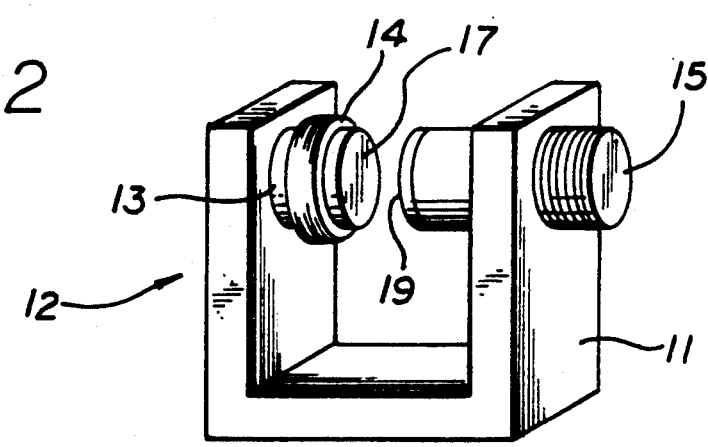
FIG. 3
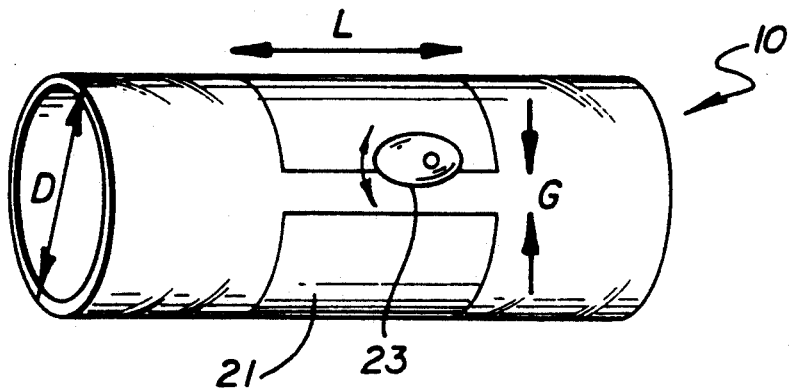
FIG. 4A
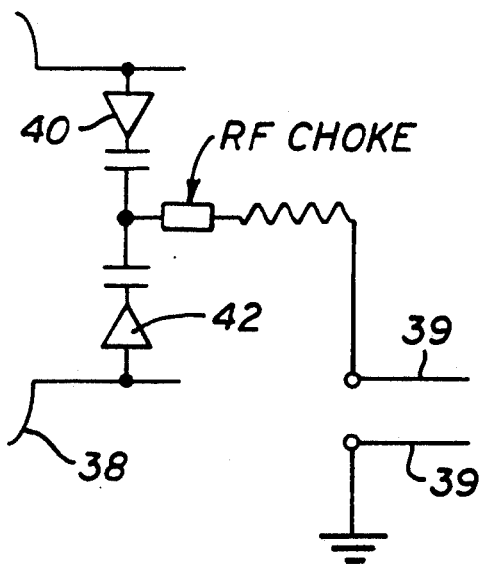
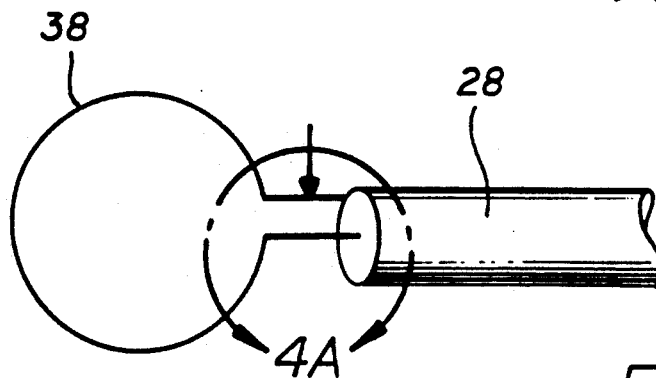
FIG. 4

PORTABLE DEDICATED ELECTRON SPIN RESONANCE SPECTROMETER

BACKGROUND OF THE INVENTION

This invention relates to electron spin resonance (ESR) spectrometers and more particularly to a portable electron spin resonance spectrometer which is dedicated to a limited range of applications.

Applications include, inter alia, immunoassay work as in determining antigen-antibody reaction, in determining the presence of drugs in body fluids; in determining the presence of certain contaminants in motor oil or other fluids; in tracing the underground flow of crude oil, in security systems wherein a card is impregnated with a spin labelled material, and in dating of archaeological finds. Currently there is a great volume of work being done to test blood or urine for the presence of drugs. it is expected that there will be increased use of ESR technology for security applications wherein a spin labelled material is sealed in a card like a credit card and an ESR sensor used to read the card to establish that the card carrier is to be admitted to a secured facility.

Electron spin resonance spectrometers are well known as laboratory devices, and in the form of research devices, typically incorporate magnets weighing a ton or more. Thus such devices are far too large and heavy to be reasonably portable. Some smaller bench top devices which have been available are also much too heavy to be readily transferred from an office or laboratory to the field for analytical work. There is, however, a need for an electron spin resonance spectrometer, or ESRS, which is readily portable and which can be carried to the field to do analysis of a specific and narrowly defined type. Such an ESRS should also be capable of being operated by field workers having minimal training. The usual large laboratory ESRS machines require technicians having a substantial level of training because of the nature of the instrumentation employed.

BRIEF DESCRIPTION OF THE INVENTION

This invention provides an electron spin resonance spectrometer including a permanent magnet of unusually small size and weight, a microwave source, a circulator and a resonator containing a sample having a property to be determined, the resonator being inductively coupled to the circulator through a closed loop matching circuit which operates to optimize the inductive coupling. The magnetic field produced by the magnet is modulated by a audio frequency signal combined with a slow ramp signal. The audio frequency signal is also supplied to a phase sensitive detector. Reflected Electron Spin Resonance (ESR) signals from the circulator are detected and amplified in a special amplifier which sends the ESR signal to the phase sensitive detector which removes noise by amplifying only ESR signals which are in phase and at the specific audio frequency supplied to the phase sensitive detector. The amplifier also supplies a signal varying with detector current to a single board computer which uses this signal to control the output frequency of the microwave source. The computer is connected to an input key pad and an output display means and also provides the output signal to tune the matching circuit. The system is sufficiently complete and automatic that it can be operated to perform its dedicated task by personnel having very limited training. Essentially, all that is required of the operator is knowledge sufficient to place the sample in the resonator, request the desired read out on the key pad and to recognize the desired output on the display means.

BRIEF DESCRIPTION OF THE DRAWING

This invention may be more clearly understood from the following detailed description and by reference to the drawings in which:

FIG. 2 is a perspective drawing of a permanent magnet assembly usable with the system of FIG. 1;

FIG. 3 is a perspective drawing of a strip gap resonator usable with the system of FIG. 1;

FIG. 4 is a schematic diagram of an impedance matching structure used with the system of FIG. 1;

FIG. 4A is an enlarged view of a portion of FIG. 4 shown in circle A—A.

DETAILED DESCRIPTION OF THE INVENTION

Figure 1:
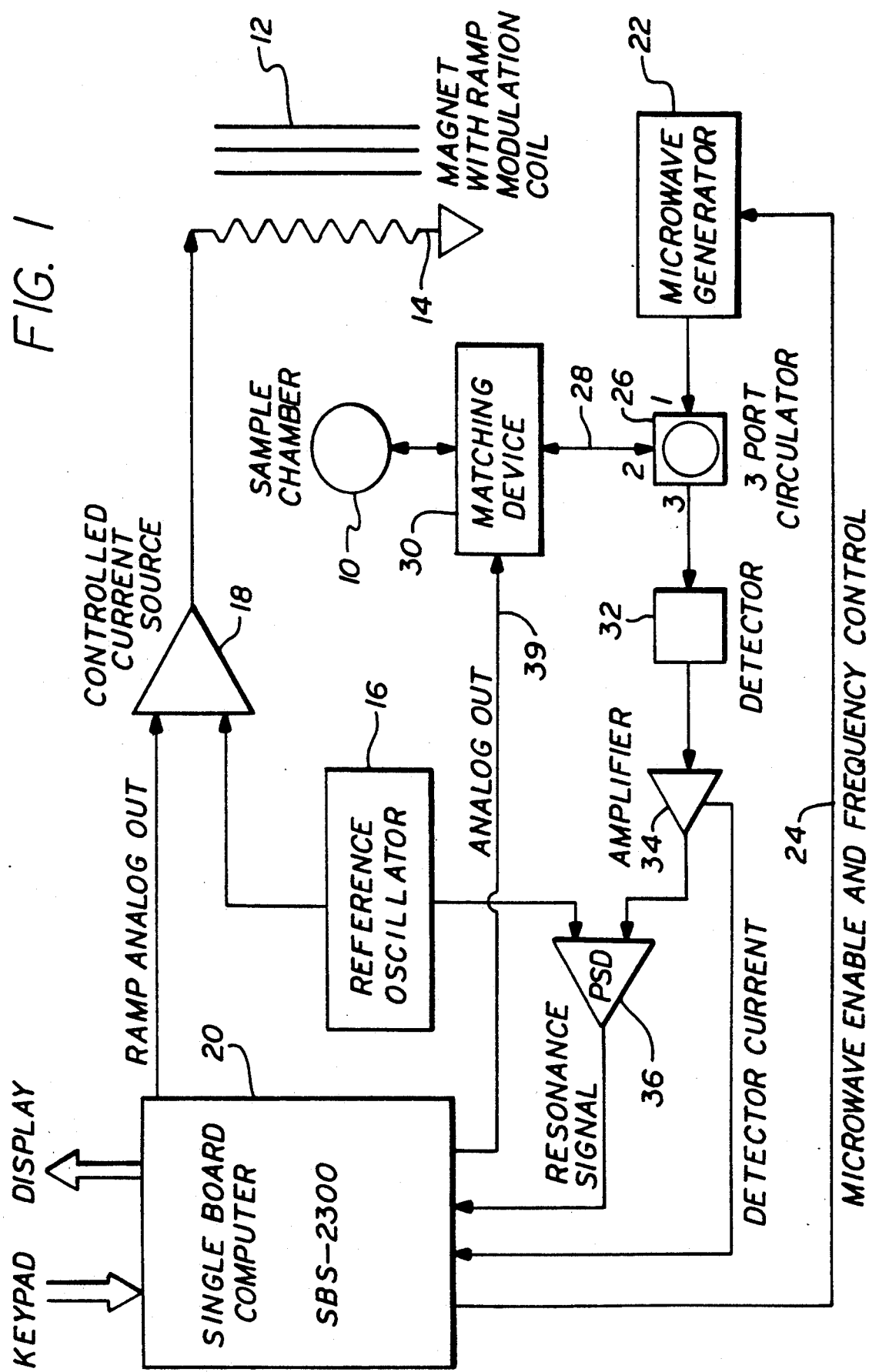
FIG. 1 is a schematic system block diagram of an Electron Spin Resonance Spectrometer (ESRS) according to our invention.

Referring now to FIG. 1, a sample which might, for example, be a blood or urine sample suspected of containing drugs together with a specific reagent capable of being detected by ESR, or a solid such as a credit card to validate, or gem to authenticate, or a sample you wish to date, is placed in a sample chamber 10 where it is exposed to a strong magnetic field from a permanent magnet 12. Magnet 12 has closely associated with it, a coil 14 which may be wrapped around a pole piece of the magnet and which is supplied with an alternating current of a frequency such as 3.5 kHz. This 3.5 kHz current is generated in a reference oscillator 16 and is supplied to a summing circuit 18 which sums the 3.5 kHz current with a ramp signal supplied from a single board computer 20. The ramp signal is very slow, having a repetition rate in the order of one minute. Thus the permanent magnet produces a magnetic field which is modulated by the combined ramp and 3.5 kHz signals.

The permanent magnet assembly 12 is shown in FIG. 2 and includes a steel yoke 11 including a permanent magnet tail piece 13 and an adjustable permanent magnet member 15 which can be moved to adjust the air gap and to accommodate various sample chamber configurations. Each of tail piece 13 and magnet member 15 include permanent magnet cylindrical members covered by pole pieces 17, 19 of amorphous iron (Metglas) which serve to provide a more homogeneous magnetic field. Members 13 and 15 each support copper wound coils 14 which supply a modulated magnetic field ramp signal as described above. The magnetic members 13, 15 and pole pieces 17, 19 are about two inches in diameter and the entire assembly 12 is approximately five inches square, so the magnet assembly is unusually small for an ESR application and produces a magnetic field in the range of 700 Gauss.

The sample chamber 10, in addition to being a container, is a microwave resonator and, in a preferred form, includes a specially modified quartz cylinder although it may be a helix, or a flat coil into which the sample is introduced. For a sample suspected of containing drugs, the chamber is preferably a strip gap resonator including a quartz container (See FIG. 3) similar to a test tube, having deposited on its surface a circumferential ring 21 about 1-5 micrometers thick of silver leaving a very small gap. The frequency of the resonator depends upon the diameter of the tube D and the width of the gap G and has been determined by applicants as follows:

$$f_o = -0.79 - 0.66\sqrt{G} + \frac{7.69}{\sqrt{D}} + 6.46\frac{\sqrt{G}}{\sqrt{D}}$$

where $f_o$ is the resonant frequency in GHz, G is the width of the gap in millimeters and D is the outside diameter or the tube in millimeters. The resonant frequency has been found to be relatively insensitive to the height L of the metal deposit 21. Gap G could be formed as two or more physical gaps, if desired or could be made variable in width as by means of an adjustable cam 23. Different gap widths are in general easier to fabricate on separate quartz tubes of cylinders.

A microwave generator, which may be a solid state oscillator, is shown at numeral 22 and is enabled as controlled by computer 20 through a line 24 to produce a microwave output at approximately 2 GHz. This differs from the usual 9 GHz (approximately) which is used in most ESR systems. One reason for the 2 GHz frequency is that, when using samples containing water, absorption of microwave energy is less severe at this frequency as compared with 9 GHz. The output from microwave generator 22 is supplied to port 1 of a three port circulator 26 which sends this output from port 2 through a microwave conduit 28 which may be a coaxial cable to a matching circuit 30 which is used to adjust the coupling of microwave energy into the sample chamber 10. Some microwave energy is reflected back through conduit 28 to the circulator which sends it via port 3 to a detector 32 which is preferably a zero bias Schottky diode such as one manufactured by Triangle Microwave, 31 Farinella Drive, East Hanover, N.J. 01936 which requires no artificial mismatch to bias the detector, thereby resulting in greater sensitivity.

The detected signal is supplied to an amplifier 34 which supplies detector current to the single board computer 20 which the computer uses for frequency control to microwave generator 22 and for coupling control, as discussed below. Amplifier 34 also amplifies the electron spin resonance (ESR) signal which is a voltage and which is then supplied to a phase sensitive detector 36. Amplifier 34 further includes filtering circuits for filtering both the detector current and ESR signals.

The phase sensitive detector 36 receives both the 3.5 kHz oscillator signal as a reference and the amplified ESR signal and amplifies that portion of the ESR signal which is in phase with the reference oscillator signal. Since this same reference signal is used to modulate the magnetic field around the sample chamber, any ESR sensitive materials will produce an output signal based on this reference signal. Most noise components of the ESR signal are rejected by the phase sensitive detector because they are unrelated to the 3.5 kHz reference signal. A phase sensitive detector found by applicants to be satisfactory is one built by Evans Electronics, Berkeley, Calif., Model No. 4110.

The matching device 30 couples microwave energy into the resonator or sample chamber 10 and is shown in more detail in FIG. 4. The coupling loop 38 inductively couples the energy to the resonator and the impedance match is initially adjusted mechanically by fixing the proper distance between the coupling loop 38 and the resonator. Under software control, the computer 20 sets the frequency of the microwave generator 22 to correspond to the frequency of the sample chamber 10. The computer then makes a decision based on the value of the detector current received from the amplifier 34 whether matching adjustment is needed. If it is needed, an analog signal is sent via line 39 to the matching device 30 while monitoring the detector current until the minimum detector current is achieved. The varactor diodes 40, 42 (FIG. 4A) are thereby adjusted by the computer 20 to maintain the impedance match without operator intervention. This process affects the frequency of the sample chamber 10 slightly so the frequency is readjusted. Frequency adjustment and matching adjustment are repeated in sequence until the desired minimum in detector current is achieved. Reflected power appears at the third port of the circulator 26 and is rectified by the detector diode 32.

Other known types of resonant structures which may be employed in connection with applicants' system include the helix resonator which is well known [R. H. Webb, Rev. Sci. Inst. 33, 732-737 (1962); F. Volino, F. Csakvary, and P. Servoz-Gavin, Rev. Sci. Inst. 39, 1660-1665 (1968)], and the flat coil resonator described by H. Nishakawa, et al. [H. Nishakawa, H. Fujii, and L. J. Berliner, J. Magn. Reson., 62, 79-86 (1985)]. All three resonant structures serve the purpose of concentrating the microwave magnetic field at the position of the sample, thereby increasing the sensitivity in proportion to the quality factor of the structure Q.

Figure 5:
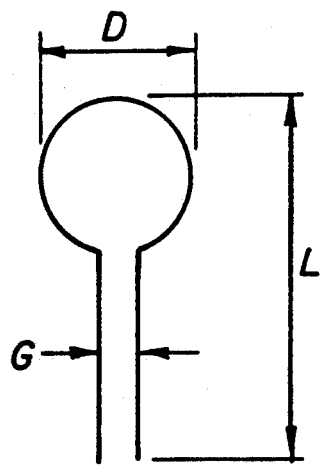
FIG. 5 is a schematic drawing of an alternative form of resonator usable with the system of FIG. 1.
Figure 6:
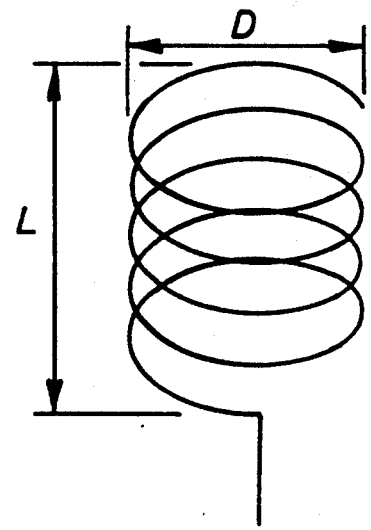
FIG. 6 is a schematic drawing of another alternate form of resonator usable with the system of FIG. 1.

FIGS. 5 and 6 show the flat coil and helix resonators, respectively. The theoretical resonant frequency and the quality factor of the helix has been given in the Voline, et al. article referred to above while no reliable theory has been advanced for the flat-coil. Our original work on the latter structure shows that $$f_o = \frac{7.5\,F}{L + 0.57\,D}$$

where $f_o$ is the resonant frequency in GHz, the dimensions L and D are in cm and are shown in FIG. 6 and F is an empirical correction factor, depending on dimension G, that approaches unity when G is near zero. A variation in $f_o$ of a full octave may be achieved by "spreading the legs" of the flat-coil structure; thus this structure is easily tuned.

As discussed above, the amplified detector current from amplifier 34 is supplied to the computer 20. Depending upon the polarity and magnitude of this detected d.c. signal, the computer sends signals along line 24 to correct the frequency of the microwave generator 22. Computer 20 is a commercially available single board computer built by Octagon Systems, Westminster, Colo., Model SBS-2300. This computer uses analog inputs and outputs and drives a small flat panel display which displays operator instructions and test results.

The ESR signal from phase sensitive detector 36 is a voltage which the computer receives and interprets as either being the appropriate signal for a positive test or not. The computer 20, which includes the usual clock, also provides the long term ramp voltage to the summing circuit 18 and an output to the flat panel display.

Figure 7:
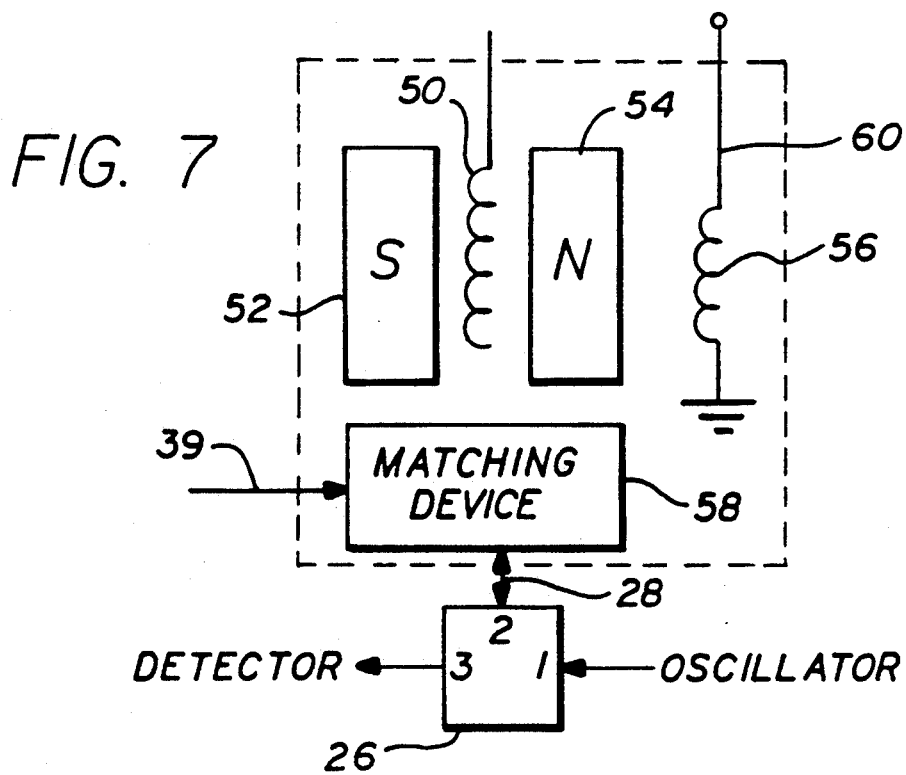
FIG. 7 is a schematic drawing of a type of remote sensor which might be incorporated in the system of FIG. 1.

As indicated above, one application of ESR technology is in determining the presence or flow pattern of oil down the hole. This requires a remote sensor such as that shown in FIG. 7 which utilizes structure similar to that of FIG. 1 including the magnet 12, coil 14, matching device 30 and a suitable resonant structure such as one of those shown in FIGS. 5 and 6. In FIG. 7 is shown a resonant structure in the form of a helix 50 located between north and south magnetic members 52 and 54 whose field is subject to modulation by means of a coil 56. A matching device 58 which may be similar or identical to that shown in FIG. 4A is inductively coupled to the helix 50. Matching device 58 is connected to a conductor line 39 and to port 2 of the circulator 26 via coaxial cable 28 and coil 56 is connected to controlled current source 18 through a conductor line 60. Coaxial cable 28 and lines 39 and 60 may need to be very long, such as several thousand feet, to reach the desired position at the bottom of an oil well. Such line lengths may require the installation of in line amplifiers to boost the signals. The sensor or probe described above can be assembled in a very small housing attached to a cable containing coaxial cable 28 and lines 39 and 60 suitable to be dropped into the well. With such a device the crude oil itself passing through the housing would provide signals showing presence of asphaltene free radicals as described in the United States patent to Nicksie and Starke U.S. Pat. No. 4,560,663. To track underground flow one could add spin labeled compounds [SL] at a first location as described in U.S. Pat. No. 3,993,131, and sense the presence of oil containing SL at another well location by means of the probe described above.

The above described embodiments of the present invention are merely descriptive of its principles and are not to be considered limiting. For example, the 2 GHz microwave frequency described above has been found useful because water or water based fluids do not absorb energy as severely as would be the case with the more commonly used frequencies in the range of 9 GHz making the specific structure described useful for analyzing blood or urine samples. Other applications may use frequencies as high as 34 GHz or more depending upon the samples employed. As will be recognized by those skilled in microwave technology, such changes may alter specific hardware items, but their functions remain the same. Other changes and variants will occur to those skilled in the art and we do not wish to be limited by the scope of the particular embodiment described. The scope of the present invention instead shall be determined from the scope of the following claims including their equivalents.

What is claimed is:

1. An electron spin resonance spectrometer for detecting at least one property of a sample comprising:
    a resonator containing said sample, coupling means inductively coupled to said resonator and spaced therefrom and a matching circuit connected to said coupling means;
    a circulator connected to said matching circuit;
    a microwave source for providing microwave radiation to said circulator, said circulator directing microwave radiation to said matching circuit and receiving a microwave spin resonance signal from said matching circuit;
    a detector connected to receive said microwave spin resonance signal from said circulator;
    means responsive to said detected signal connected to said matching circuit to maintain impedance match between said coupling means and said resonator;
    means creating a substantially homogeneous magnetic field around said sample;
    a reference oscillator;
    means creating a ramp signal;
    amplifier means connected to receive said reference oscillator signal and said ramp signal and creating a composite signal connected to said magnetic field creating means to modulate said magnetic field;
    a phase sensitive detector connected to receive the spin resonance signal from said detector and the output from said reference oscillator; and
    output means responsive to the output of said phase sensitive detector indicating the presence of said property of said sample.

2. An electron spin resonance spectrometer as claimed in claim 1 wherein said spectrometer includes a computer, keypad input means and display means connected to said computer, said phase sensitive detector supplying an output to said computer and said computer creating said ramp signal.

3. An electron spin resonance spectrometer as claimed in claim 1 wherein said impedance matching means includes a coupling loop physically positioned at a desired distance from said resonator, said matching circuit includes varactor diodes connected between said loop and said circulator and means responsive to the reflected power from said matching means connected to said matching circuit to vary the signal to said varactor diodes to minimize said reflected power.

4. An electron spin resonance spectrometer as claimed in claim 3 wherein said resonator is a strip gap resonator comprising a generally cylindrical quartz member having an interrupted metal ring on its surface inductively coupled to said loop.

5. An electron spin resonance spectrometer as claimed in claim 3 wherein said resonator is a helical member inductively coupled to said loop.

6. An electron spin resonance spectrometer as claimed in claim 3 wherein said resonator is a flat coil resonator.

7. An electron spin resonance spectrometer as claimed in claim 1 characterized in that said resonator is a strip gap resonator comprising a quartz generally cylindrical member having a metal ring plated thereto;
    said ring having a length parallel to the height of said cylindrical member which is substantially less than the height of said cylindrical member and a narrow gap preventing complete closure of said ring; and
    a matching loop connected to said circulator and inductively coupled to said resonator is physically located at a desired distance from said metal ring to substantially match the impedance between said resonator and said circulator.

8. An electron spin resonance spectrometer as claimed in claim 7 wherein said matching circuit includes varactor diodes connected between said circulator and said matching loop and means responsive to the reflected power from said matching circuit varies the signal to said varactor diodes to minimize said reflected power.

9. An electron spin resonance spectrometer as claimed in claim 1 wherein said magnetic field creating means comprises a pair of permanent magnets held in fixed relationship to each other and a U-shaped frame of ferrous material supporting said magnets on opposite legs thereof, pole pieces on adjacent parts of said magnets formed of amorphous iron, and a toroidal ramp and modulation coil surrounding at least one of said permanent magnets.

10. An electron spin resonance spectrometer as claimed in claim 9 wherein adjustable means are provided to vary the spacing between said magnets.

11. An electron spin resonance spectrometer as claimed in claim 10 wherein said pole pieces and said magnets are less than approximately three inches in diameter and said magnetic field creating means does not exceed approximately five inches square.

12. An electron spin resonance spectrometer as claimed in claim 1 wherein said microwave source produces radiation frequency of approximately 2 GHz.

13. An electron spin resonance spectrometer as claimed in claim 3 wherein said microwave source produces radiation frequency of approximately 2 GHz.

14. An electron spin resonance spectrometer as claimed in claim 1 wherein said reference oscillator produces a reference frequency of approximately 3.5 kHz.

15. An electron spin resonance spectrometer as claimed in claim 3 wherein said reference oscillator produces a reference frequency of approximately 3.5 kHz.

16. An electron spin resonance spectrometer for detecting at least one property of a sample comprising:
  magnetic means for producing a magnetic field to which said sample is exposed, coil means associated with said magnetic means, means producing a magnetic field ramp signal, a reference oscillator producing a reference signal, and a summing circuit receiving said magnetic field ramp signal and said reference signal producing a composite signal connected to said coil means to modulate said magnetic field;
  a circulator, a microwave source, and a impedance matching circuit connected to said circulator and a resonator in which said sample is deposited, said resonator being inductively coupled to said matching circuit;
  a detector connected to said circulator for receiving modulated microwave signals from said matching circuit;
  amplifier means connected to said detector;
  a phase sensitive detector connected to said reference oscillator and said amplifier means;
  a keypad;
  display means; and
  computer means connected to receive amplified detector current from said amplifier means, a resonance signal from said phase sensitive detector and an input from said keypad and providing a frequency control output to said microwave source, an analog output to said matching circuit to adjust the coupling of microwave energy to said resonator, said magnetic field ramp signal to said summing circuit, and an output to said display means for displaying the output of said spectrometer.

17. An electronic spin resonance spectrometer as claimed in claim 16 wherein impedance matching circuit is connected to said circulator including a coupling loop physically positioned at a desired distance from said resonator, said matching circuit including varactor diodes connected between said loop and said circulator and means responsive to the reflected power from said matching circuit connected to said matching circuit to vary the signal to said varactor diodes to minimize said reflected power.

18. An electron spin resonance spectrometer as claimed in claim 16 wherein said computer means includes keypad input means and display means connected to said computer, said phase sensitive detector supplying an output to said computer and said computer creating said ramp signal.

19. An electron spin resonance spectrometer as claimed in claim 16 wherein said magnetic means comprises a pair of permanent magnets held in fixed relationship to each other and a U-shaped frame of ferrous material supporting said magnets on opposite legs thereof, pole pieces on adjacent parts of said magnets formed of amorphous iron, and a toroidal ramp and modulation coil surrounding at least one of said permanent magnets.

20. An electron spin resonance spectrometer as claimed in claim 16 wherein the connections between said microwave source and said circulator and between said matching circuit and said circulator are coaxial cables.

21. For use with an electron spin resonance spectrometer for detecting at least one property of a sample at a remote location such as down a well, said spectrometer including a microwave circulator, a microwave source providing radiation to said circulator, a detector connected to said circulator, a reference oscillator, a computer including means creating a ramp signal, amplifier means combining said oscillator and ramp signals to create a composite signal, a phase sensitive detector connected to said detector and to said reference oscillator, said computer receiving the output of said phase sensitive detector and operating to control the output frequency of said microwave source, and means displaying the output of said spectrometer, an apparatus further comprising:
  an operating probe at said remote location including a resonator and means exposing said sample to said resonator;
  permanent magnet means creating a substantially homogeneous magnetic field around said sample;
  a winding fixed to said permanent magnet means and connected through a first long conductor to receive said composite signal to ramp and modulate said magnetic field;
  a microwave matching device connected to an intermediate port of said circulator and inductively coupled to said resonator, said connection including a coaxial cable; and
  means connecting said matching device to said computer through a second long conductor for tuning said matching device to adjust the coupling of said microwave radiation to said resonator.

22. A remote operating probe as claimed in claim 21 wherein said coaxial cable is of substantially equal length to said first and second elongated conductors, said cable and said conductors being insulated from each other and from the environment.

23. A remote operating probe as claimed in claim 21 wherein said probe includes an external housing, said housing including ports for receiving liquid sample material.

24. A remote operating probe as claimed in claim 21 wherein said probe includes openings for receiving solid sample material.

* * * * *